United States Patent
Terasaki et al.

(10) Patent No.: US 7,795,156 B2
(45) Date of Patent: Sep. 14, 2010

(54) PRODUCING METHOD OF SEMICONDUCTOR DEVICE

(75) Inventors: Tadashi Terasaki, Imizu (JP); Akito Hirano, Toyama (JP); Masanori Nakayama, Toyama (JP); Unryu Ogawa, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 11/664,287

(22) PCT Filed: Oct. 31, 2005

(86) PCT No.: PCT/JP2005/020013

§ 371 (c)(1),
(2), (4) Date: Aug. 10, 2007

(87) PCT Pub. No.: WO2006/049130

PCT Pub. Date: May 11, 2006

(65) Prior Publication Data

US 2007/0298622 A1    Dec. 27, 2007

(30) Foreign Application Priority Data

Nov. 5, 2004  (JP) .............................. 2004-321439
May 10, 2005  (JP) .............................. 2005-137308

(51) Int. Cl.
*H01L 21/469* (2006.01)
(52) U.S. Cl. ...................... 438/758; 438/216; 438/261; 438/591; 438/776; 438/199; 438/185; 438/763; 438/275; 438/590; 257/E21.001; 257/E21.006; 257/410; 257/411

(58) Field of Classification Search ................... 438/758
See application file for complete search history.

(56) References Cited

U.S. PATENT DOCUMENTS 4,762,728 A * 8/1988 Keyser et al. ............... 438/437
4,980,307 A * 12/1990 Ito et al. ..................... 438/591
5,397,720 A * 3/1995 Kwong et al. ............... 438/301
5,407,870 A * 4/1995 Okada et al. ................ 438/591

(Continued)

FOREIGN PATENT DOCUMENTS

CN        1398005 A     2/2003

(Continued)

*Primary Examiner*—Fernando L Toledo
*Assistant Examiner*—Ankush K Singal
(74) *Attorney, Agent, or Firm*—Birch, Stewart, Kolasch & Birch, LLP

(57) ABSTRACT

Disclosed is a producing method of a semiconductor device comprising a step of forming a tunnel insulating film of a flash device comprising a first nitridation step of forming a first silicon oxynitride film by nitriding a silicon oxide film formed on a semiconductor silicon base by one of plasma nitridation and thermal nitridation, the plasma nitridation carrying out nitridation process by using a gas activated by plasma discharging a first gas including a first compound which has at least a nitrogen atom in a chemical formula thereof, and the thermal nitridation carrying out nitridation process using heat by using a second gas including a second compound which has at least a nitrogen atom in a chemical formula thereof, and a second nitridation step of forming a second silicon oxynitride film by nitriding the first silicon oxynitride film by the other of the plasma nitridation and the thermal nitridation.

7 Claims, 3 Drawing Sheets

U.S. PATENT DOCUMENTS

| | | | |
|---|---|---|---|
| 6,153,480 A * | 11/2000 | Arghavani et al. | 438/296 |
| 6,261,976 B1 * | 7/2001 | Dong | 438/786 |
| 6,362,085 B1 * | 3/2002 | Yu et al. | 438/585 |
| 6,555,485 B1 * | 4/2003 | Liu et al. | 438/776 |
| 6,610,615 B1 * | 8/2003 | McFadden et al. | 438/776 |
| 7,022,626 B2 * | 4/2006 | Chou et al. | 438/795 |
| 7,179,754 B2 * | 2/2007 | Kraus et al. | 438/775 |
| 2002/0130377 A1 * | 9/2002 | Khare et al. | 257/410 |
| 2002/0197882 A1 * | 12/2002 | Niimi et al. | 438/775 |
| 2002/0197884 A1 * | 12/2002 | Niimi et al. | 438/775 |
| 2003/0015763 A1 | 1/2003 | Yoneda | |
| 2003/0077864 A1 | 4/2003 | Wakamiya | |
| 2003/0207555 A1 * | 11/2003 | Takayanagi et al. | 438/590 |
| 2003/0232491 A1 * | 12/2003 | Yamaguchi | 438/591 |
| 2004/0070046 A1 * | 4/2004 | Niimi | 257/510 |
| 2004/0175961 A1 * | 9/2004 | Olsen | 438/786 |
| 2004/0185673 A1 * | 9/2004 | Ichijo et al. | 438/758 |
| 2004/0242021 A1 * | 12/2004 | Kraus et al. | 438/776 |
| 2004/0248392 A1 * | 12/2004 | Narwankar et al. | 438/584 |
| 2005/0085092 A1 * | 4/2005 | Adetutu et al. | 438/763 |
| 2005/0118836 A1 * | 6/2005 | Chou et al. | 438/786 |
| 2005/0260357 A1 * | 11/2005 | Olsen et al. | 427/569 |
| 2008/0090425 A9 * | 4/2008 | Olsen | 438/786 |

FOREIGN PATENT DOCUMENTS

| | | |
|---|---|---|
| JP | 2001-93903 A | 4/2001 |
| JP | 2003-133550 A | 5/2003 |

* cited by examiner

PRODUCING METHOD OF SEMICONDUCTOR DEVICE

The present invention relates to a producing method of a semiconductor device, and more particularly, to a producing method of a flash device using plasma processing.

A tunnel oxide film of a conventional semiconductor device, for example, of a flash device, is a silicon oxide ($SiO_2$) film. Through the tunnel oxide film electrons are repeatedly injected and withdrawn at a high electric field, resulting in a prominent problem called Stress Induced Leakage Current (SILC) with a thinning tendency of the tunnel oxide film according to the recent miniaturization. As a measure to solve this problem, the present inventors have attempted to enhance SILC endurance by carrying out high temperature thermal nitridation process after the tunnel oxide film has been formed to add nitrogen near an interface of the tunnel oxide film with the base.

However, the SILC endurance has yet been insufficient even when the high temperature thermal nitridation process has been carried out after the tunnel oxide film has been formed to add nitrogen near the interface of the tunnel oxide film with the base.

Hence, it is a main object of the present invention to provide a producing method of a semiconductor device capable of enhancing SILC endurance.

According to one aspect of the present invention, there is provided a producing method of a semiconductor device comprising a step of forming a tunnel insulating film of a flash device, comprising:

a first nitridation step of forming a first silicon oxynitride film by nitriding a silicon oxide film formed on a semiconductor silicon base by one of plasma nitridation and thermal nitridation, the plasma nitridation carrying out nitridation process by using a gas activated by plasma discharging a first gas including a first compound which has at least a nitrogen atom in a chemical formula thereof, and the thermal nitridation carrying out nitridation process using heat by using a second gas including a second compound which has at least a nitrogen atom in a chemical formula thereof, and a second nitridation step of forming a second silicon oxynitride film by nitriding the first silicon oxynitride film by the other of the plasma nitridation and the thermal nitridation.

According to another aspect of the present invention, there is provided a producing method of a semiconductor device comprising a step of forming a silicon oxynitride film by nitriding a silicon oxide film formed on a semiconductor silicon base, wherein the silicon oxide film is nitrided so as to form peaks of nitrogen concentration in a range of up to 3 nm in a depth direction towards a surface from an interface between the semiconductor silicon base and the silicon oxynitride film and in a range of up to 3 nm in a depth direction towards an interface with the base from a surface of the silicon oxynitride film, respectively.

BRIEF DESCRIPTION IN THE DRAWINGS

Figure 1:
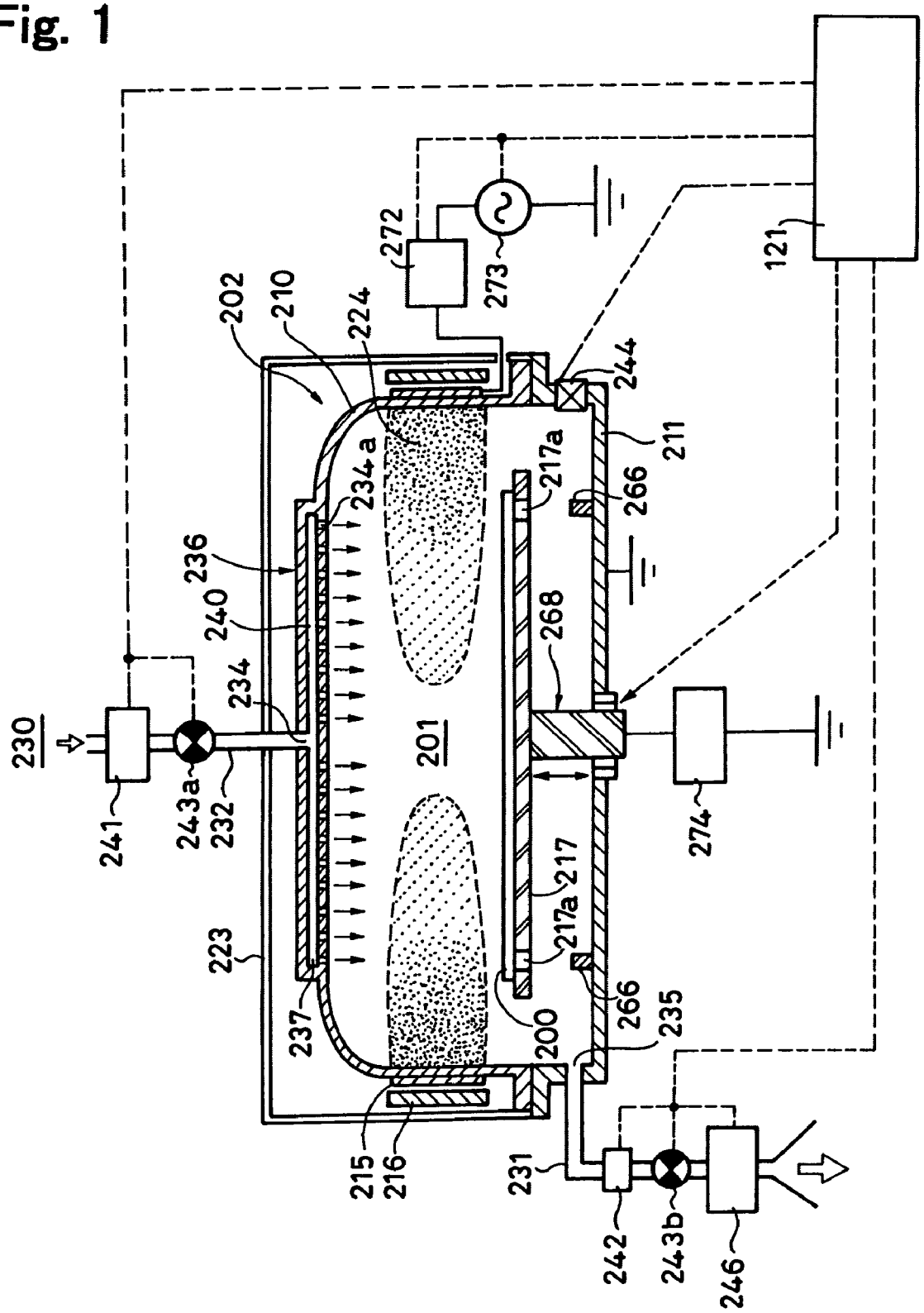
FIG. 1 is a schematic sectional view for explaining a plasma processing furnace used in a producing method of a semiconductor device of a preferred embodiment of the present invention.

Next, preferable embodiments of the present invention will be described.

According to a preferable embodiment of the present invention, there is provided a producing method of a semiconductor device comprising a step of forming a tunnel insulating film of a flash device, comprising:

a first nitridation step of forming a first silicon oxynitride film by nitriding a silicon oxide film formed on a semiconductor silicon base by one of plasma nitridation and thermal nitridation, the plasma nitridation carrying out nitridation process by using a gas activated by plasma discharging a first gas including a first compound which has at least a nitrogen atom in a chemical formula thereof, and the thermal nitridation carrying out nitridation process using heat by using a second gas including a second compound which has at least a nitrogen atom in a chemical formula thereof, and a second nitridation step of forming a second silicon oxynitride film by nitriding the first silicon oxynitride film by the other of the plasma nitridation and the thermal nitridation.

The tunnel insulation film of the flash device is thicker comparing to a gate insulation film 2 nm of a MOS device. In a design rule of 65 nm, the film thickness is about 6.5 nm, for example.

Plasma nitridation can only nitride up to about 3 nm to 4 nm in depth. However, thermal nitridation can nitride even deeper.

In the flash device, leakage of the tunnel insulating film increases by repeating a rewrite operation for long time. However, the above described plasma nitridation and thermal nitridation can carry out nitridation widely in a depth direction. Thus, such leakage can be reduced.

In the existing design rule of 65 nm, a silicon oxide film is used for the tunnel insulating film of the flash device. Nitridation of the silicon oxide film to reduce the leakage is an effective means. Even when a silicon nitride film or a silicon oxynitride film is formed by Chemical Vapor Deposition (CVD) method, defects are abundant inside the films and the films cannot be used as a tunnel insulating film of the flash device. Thus, nitridation carried out by plasma processing is needed.

Preferably, the silicon oxide film to be nitrided has a film thickness of 4 to 8 nm.

Preferably, peaks of nitrogen concentration are formed in a range of up to 3 nm in a depth direction towards a surface from an interface between the base and the second silicon oxynitride film and in a range of up to 3 nm in a depth direction towards the interface with the base from the surface of the second silicon oxynitride film, respectively.

When using the flash memory, an electric field concentrates within 3 nm from the interface between the base and the silicon oxide film which is the tunnel oxide film and within 3 nm from the surface of the silicon oxide film which is the tunnel oxide film. Therefore, nitridation of the silicon oxide film in these regions is particularly effective for suppressing or preventing the leakage of the tunnel insulating film.

Preferably, the second compound is NO or $N_2O$.

A region near the interface with the base can be thermally nidrided by using NO gas or $N_2O$ gas even when the tunnel insulating film is thick having the thickness more or equal to 6.5 nm. When tempting to use, for example, $N_2$ instead of NO or $N_2O$ to carry out thermal nitridation, heating in which the heating temperature is more or equal to 1150° C. is needed. Thus, it is subjected to restriction because a device which can endure this temperature need to be used.

Preferably, the second silicon oxynitride film is formed by the thermal nitridation after the first silicon oxynitride film is formed by the plasma nitridation. Contrary to this, when carrying out plasma nitridation after carrying out thermal nitridation, anneal processing is needed separately afterwards. This adds one more step and the throughput drops. In contrast, when plasma nidriding is carried out first and then, thermal nitridation is carried out, a separate anneal processing is not needed and the throughput enhances.

Further, according to a preferable aspect of the present invention, there is provided a producing method of a semiconductor device comprising a step of forming a silicon oxynitride film by nitriding a silicon oxide film formed on a semiconductor silicon base, wherein the silicon oxide film is nitrided so as to form peaks of nitrogen concentration in a range of up to 3 nm in a depth direction towards a surface from an interface between the semiconductor silicon base and the silicon oxynitride film and in a range of up to 3 nm in a depth direction towards an interface with the base from a surface of the silicon oxynitride film, respectively.

When using the flash memory, an electric field concentrates within 3 nm from the base interface between the base and the silicon oxide film which is the tunnel oxide film and within 3 nm from of the surface of the silicon oxide film. Therefore, nitridation of these regions is particularly effective for suppressing or preventing the leakage of the tunnel insulating film.

The film thickness of the silicon oxide film to be nitrided is preferably between 4 to 8 nm.

Next, preferable embodiments of the present invention will be described more in detail with reference to the drawings.

FIG. 1 is a schematic sectional view for explaining a plasma processing apparatus used in a producing method of a semiconductor device of the preferred embodiments of the present invention.

This plasma processing apparatus is a substrate processing apparatus (MMT apparatus, hereinafter) which plasma-processes a substrate such as a wafer using a Modified Magnetron Typed Plasma Source which can produce high density plasma by an electric field and a magnetic field. This MMT apparatus, disposes a substrate in a processing chamber having air tightness, introduces reaction gas into the processing chamber through a shower plate, maintains the pressure in the processing chamber at a given value, supplies high frequency electricity to a discharging electrode to form the electricity field, and applies the magnetic field to cause magnetron discharge. Electrons discharged from the discharge electrode orbit while drifting and keeping cycloid motion to become long-living. Therefore, ionization generation rate becomes high, and high density plasma can be produced. By exciting and decomposing the reaction gas, various plasma processing can be carried out for substrates such as diffusion processing of oxidizing or nitridation of a surface of a substrate, formation of a thin film on a surface of a substrate, and etching of a surface of a substrate.

In MMT apparatus, a lower container 211 which is the second container and an upper container 210 which is the first container put on the lower container 211 constitute a processing chamber 201. The upper container 210 is formed into a domical shape made of aluminum oxide or quartz. The lower container 211 is made of aluminum. In addition, by constituting the susceptor 217, which is an after-mentioned heater-integrated holding body and which holds a substrate, with aluminum nitride, ceramics, or quartz, metal contaminants which are taken inside the film while processing are reduced.

A shower head 236 constituting a buffer chamber 237 which is a gas dispersion space is provided at an upper part of the upper container 210. A gas introducing port 234 which is an port for introducing gas is formed at an upper wall of the shower head. An lower wall is consisted of a shower plate 240 comprising gas jet holes 234a which are a jet hole from which gas is injected. The gas introducing port 234 is connected, by a gas supplying tube 232 which is a supply tube for supplying gas, to a gas cylinder of a reaction gas 230 (omitted from the drawing) through a valve 243a which is an open-close valve and a mass flow controller 241 which is a flow control means. A gas discharge port 235 which is a discharge port through which gas is discharged is formed in a sidewall of the lower container 211 such that reaction gas 230 is supplied from the shower head 236 to the processing chamber 201 and gas after processing of a substrate flows toward a bottom of the processing chamber 201 from peripheries of a susceptor 217. The gas discharge port 235 is connected to a vacuum pump 246 which is a discharge device through an APC 242 which is a pressure regulator and a valve 243b which is an open-close valve by the gas discharge pipe 231 which is a discharge pipe through which gas is discharged.

A cylindrical electrode 215 having a cylindrical cross section as an electrically discharging means which excites the supplied reaction gas, and preferably being the first electrode in a cylindrical shape is provided. The cylindrical electrode 215 is disposed in an outer periphery of the processing chamber 201, and is surrounding the plasma producing region 224 inside the processing chamber 201. A high frequency power supply 273 which applies high frequency electricity is connected to the cylindrical electrode 215 through a matching device 272 which matches impedance.

A cylindrical magnetic field forming means 216 is disposed on an outer surface of the cylindrical electrode 215. With this, magnetic lines of force are formed in the axial direction of the cylinder along the inner peripheral surface of the cylindrical electrode 215.

The susceptor 217 as a holding body which holds a wafer 200 which is a substrate is disposed on a central portion of a bottom of the processing chamber 201. The susceptor 217 can heat the wafer 200. For example, aluminum nitride constructs the susceptor 217 and, a heater (not shown) as heating means is integrally embedded in the susceptor 217. Electricity is applied to the heater and the wafer 200 can be heated up to about 500° C.

The second electrode which is an electrode for changing the impedance is further provided inside the susceptor 217. This second electrode contacts the ground through an impedance changing mechanism 274. A Coil and a variable condenser constitute the impedance changing mechanism 274. The impedance changing mechanism 274 can control the electric potential of the wafer 200 through the above described electrode and the susceptor 217 by controlling the number of patterns of the coil and the capacitance value of the variable condenser.

A processing furnace 202 for processing the wafer 200 by magnetron discharging by the magnetron typed plasma source comprises at least the processing chamber 201, the susceptor 217, the cylindrical electrode 215, the cylindrical magnet 216, the shower head 236, and the discharge port 235. The wafer 200 can be plasma processed in the processing chamber 201.

Surrounding the cylindrical electrode 215 and the cylindrical magnetic field forming means 216, a shielding plate 223 for effectively shielding an electric field and a magnetic field is provided so that the electric field and the magnetic field formed by the cylindrical electrode 215 and the cylindrical magnetic forming means 216 does not have an adverse affect on the outside environment and the apparatuses such as other processing furnaces.

The susceptor 217 is insulated from the lower container 211, and a sesceptor elevating mechanism 268 which is an elevating means for elevating the susceptor 217 is provided. Further, the susceptor 217 comprises through holes 217a, and wafer thrusting pins 266 which is a thrusting means for thrusting a substrate to thrust the wafer 200 are formed on the bottom surface of the lower container 211 at least in three points. The through holes 217a and the pins 266 for thrusting the wafer are formed so that the pins 266 for thrusting the wafer penetrate the through holes 217a in a state where the wafer thrusting pins 266 and the susceptor 217 are not in contact with each other when the susceptor 217 is made to come down by the susceptor elevating mechanism 268.

A gate valve 244 which becomes a partition valve is provided on a side wall of the lower container 211. When the gate valve 244 is opened, the wafer 200 is carried into the processing chamber 201 and carried out from the processing chamber 201 by the transportation means (omitted from the drawing). When the gate valve 244 is closed, the processing chamber 201 can be closed having air tightness.

A controller 121 which is a controlling means is connected to the high frequency power supply 273, the matching device 272, the valve 243a, the mass flow controller 241, the APC 242, the valve 243b, the vacuum pump 246, the susceptor elevating mechanism 268, the gate valve 244, and the high frequency power supply for applying the high frequency electricity to the heater embedded in the susceptor to control each of them.

A method of carrying out a predetermined plasma processing for a surface of the wafer 200 or a surface of the base film which is formed on the wafer 200 in the above described construction will be explained.

The wafer 200 is carried into the processing chamber 201 constituting the processing furnace 202 by the transportation means (omitted from the drawing) which transports the wafer from outside the processing chamber 201, and is transported onto the susceptor 217. The detail of this transportation operation is as follows: first, in a state where the susceptor 217 is in a lowered state and tips of the pins 266 for thrusting the wafer projecting a predetermined length higher than the surface of the susceptor 217 by penetrating the through holes 217a of the susceptor 217, the gate valve 244 provided on the lower container 211 opens; the wafer 200 is placed onto the tips of the pins for thrusting the wafer by the transportation means (omitted from the drawing); the gate valve 244 closes when the transportation means evacuates to outside of the processing chamber 201; the wafer 200 can be placed on an upper surface of the susceptor 217 when the susceptor 217 rises by the susceptor elevating mechanism 268; and the susceptor 217 further rises to the position where the wafer 200 is to be processed.

The heater embedded in the susceptor 217 is heater beforehand and heats the transported wafer 200 to a given wafer processing temperature. The pressure inside the processing chamber 201 is maintained within a given range of pressure by using the vacuum pump 246 and the APC 242.

When the wafer 200 is pre-heated to the processing temperature, reaction gas is introduced on an upper surface (processing surface) of the wafer 200 which is placed in the processing chamber 201 in a showering manner from the gas introducing port 234 through the gas jet openings 234a of the shower plate 240. At the same time, the high frequency electricity is applied to the cylindrical electrode 215 from the high frequency power supply 273 through the matching device 272. At this time, the impedance changing mechanism 274 is controlled to be in a given desired impedance value.

A magnetron discharge occurs with an effect of the magnetic field of the cylindrical magnetic field forming means 216, and electric chargees are trapped in an upper space above the wafer 200 and high density plasma is produced in the plasma producing region 224. Then, plasma processing is carried out for a surface of the wafer 200 on the susceptor 217 by the produced high density plasma. When the surface is finished being processed, the wafer 200 is carried outside the processing chamber 201 in a procedure which is backward of the procedure when the substrate is carried into by using the transportation means (omitted from the drawing).

A power on/off of the high frequency power supply 273, an adjustment of the matching device 272, an opening and closing of the valve 243a, a flow rate of the mass flow controller 241, a valve opening of the APC 242, an opening and closing of the valve 243b, an activation/shutoff of the vacuum pump 246, an elevating operation of the susceptor elevating mechanism 268, an opening and closing of the gate valve 244, and a power on/off of the high frequency power supply which applies the high frequency electricity to the heater embedded in the susceptor are controlled by the controller 121, respectively.

Figure 2:
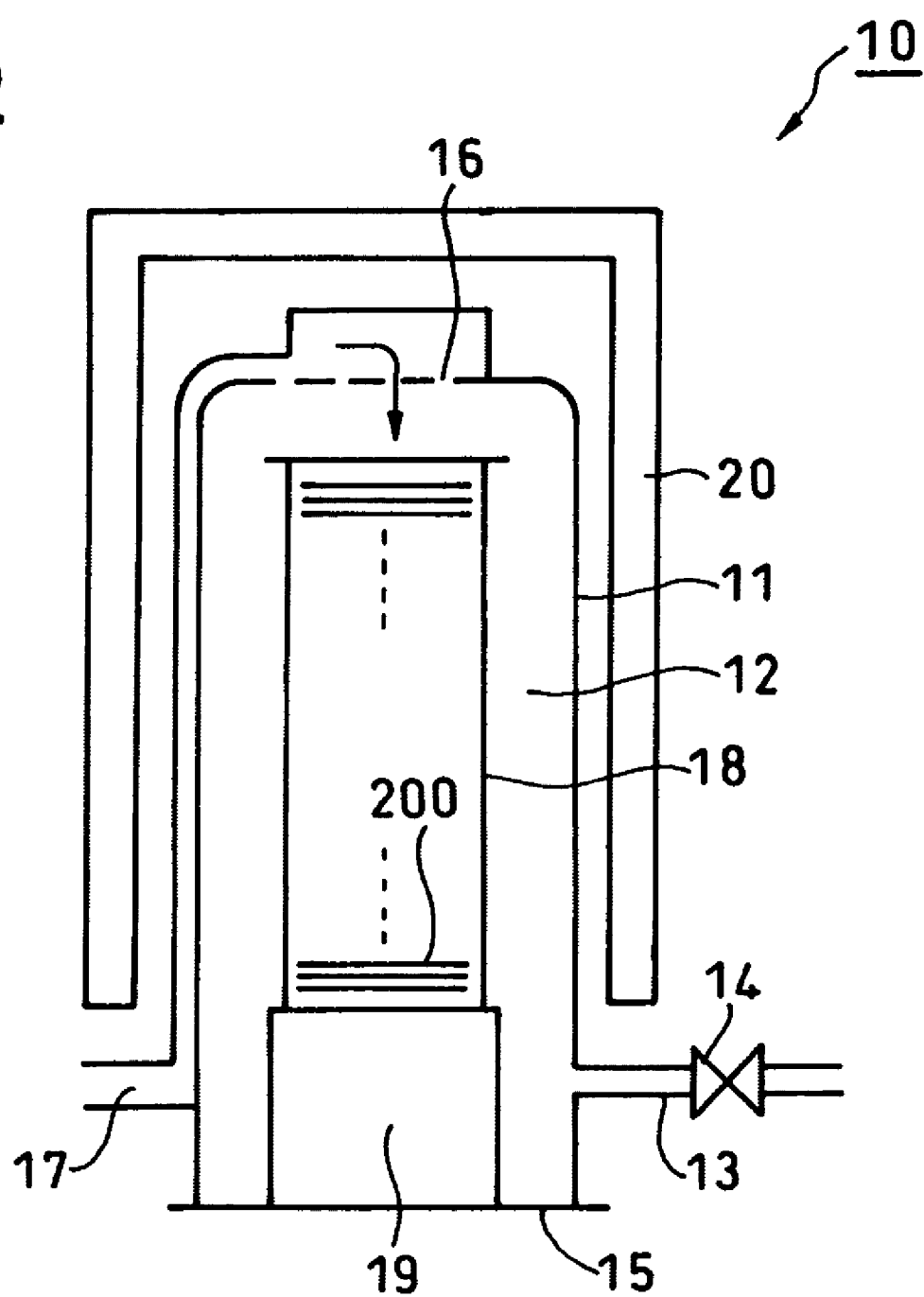
FIG. 2 is a schematic sectional view for explaining a thermal nitridation furnace used in a producing method of a semiconductor device of a preferred embodiment of the present invention.

FIG. 2 is a schematic sectional view for explaining a thermal nitridation furnace used in a producing method of a semiconductor device of preferred embodiments of the present invention.

In the thermal nitridation furnace 10, a boat 18 in which the wafers 200 in horizontal postures are loaded in layers is inserted inside the reaction tube 11. The boat 18 is installed as standing on the seal cap 15 which air-tightly closes the lower end of the reaction tube 11 via a boat mounting pedestal 19. The reacting tube 11 and the seal cap 15 constitute the processing chamber 12. Plurality of gas introducing ports 16 are formed on a ceiling face of the reaction tube 11, the gas introducing tube 17 communicates with the gas introducing port 16, and a lower end on the side wall of the reaction tube 11 communicates with the discharge tube 13. A valve 14 for the opening and closing and adjusting the pressure is provided at the discharge tube 13. A heater 20 is provided in the surrounding outside of the reacting tube 11.

Gas for nitridation process is introduced from the gas introducing tube 17 in a state where inside the reaction tube 11 is heated to a predetermined temperature by the heater 20. The thermal nitridation process is carried out to the wafer 200 in a state where the pressure inside the processing chamber 12 is maintained at a predetermined value while discharging the gas from the discharge pipe 13 by adjusting the valve 14.

Next, a preferable example of a producing method of a flash device in which the plasma processing apparatus 202 shown in FIG. 1 and the thermal nitridation furnace 10 shown in FIG. 2 are used will be described.

A silicon oxide ($SiO_2$) film which is a tunnel oxide film is formed on a silicon substrate which is a base or on an epitaxially grown silicon film which is also a base. Plasma nitridation process is carried out to this silicon oxide film by nitrogen which is activated by plasma and then, thermal nitridation process is carried out by thermally process in a nitrogen atmosphere or in a gas atmosphere including nitrogen.

Preferably, the silicon oxide film which is the tunnel oxide film is formed by high temperature thermal processing oxidization. Particularly, the silicon oxide film which is the tunnel oxide film is preferably formed by wet oxidization using Water Vapor Generator.

The processing conditions for the above described plasma nitridation process are as follows. A high frequency electric field is applied to Nitrogen ($N_2$) gas which is introduced in the processing chamber 201 shown in FIG. 1 to plasma discharge, and plasma nitridation process is carried out for the silicon oxide ($SiO_2$) film the film thickness of which is 40 to 100 Å, by nitrogen which is activated by plasma discharge. In this plasma nitridation process, a bond between silicon and nitrogen (Si—N bond) is made by adding nitrogen near the surface of the silicon oxide film (less than 30 Å above the surface of the silicon oxide film) to suppress an occurrence of crystal defects due to electrical stress. The followings are ranges of preferable conditions for plasma nitridation process. Appropriate values are to be chosen within this range, accordingly.

| | |
|---|---|
| Temperature of silicon substrate: | room temperature to 700° C. |
| Pressure inside processing chamber: | 1 to 100 Pa |
| Kind of gas: | nitrogen ($N_2$) |
| Gas flow rate: | 100 to 1000 cc/min |
| High frequency electricity: | 200 to 500 W |
| Frequency of high frequency: | 13.56 MHz |
| Processing time: | 10 to 180 sec. |

Process conditions for the above described thermal nitridation process are as follows. Nitrogen ($N_2$) gas and nitric oxide (NO) gas or nitrogen ($N_2$) gas and nitrogen dioxide ($N_2O$) gas are introduced onto the silicon substrate 200 which is heated in the processing chamber 12 shown in FIG. 2 and thermal nitridation process is carried out for the silicon oxynitride film which has been formed by plasma nitridation. In this thermal nitridation process, nitrogen ($N_2$) can be added near the interface (more than 30 Å from the interface) between the base and the silicon oxynitride film which is formed by plasma nitridation. Furthermore, the bond between silicon and nitrogen (Si—N bond) made by the above described plasma nitridation process can be made stable.

The followings are preferable conditions for thermal nitridation process.

| | |
|---|---|
| Temperature of silicon substrate: | 700 to 1000° C. |
| Pressure: | 1000 Pa to atmospheric pressure (about 100,000 Pa) |
| Kind of gas: | nitrogen ($N_2$) and nitric oxide (NO) or nitrogen ($N_2$) and nitrogen dioxide ($N_2O$) |
| Gas flow rate: | $N_2$ 1 to 10 l/min<br>NO or $N_2O$ 1 to 10 l/min |
| Processing time: | 15 to 150 min. |

Preferably, the processing time is 15 to 60 minutes. When the processing time is within 60 minutes, the processing time is shorter and is appropriate in terms of throughput. In addition, there is an effect to reduce thermal history of the transistor. Following the previous plasma nitridation process, the thermal nitridation process can be carried out consecutively in the plasma processing apparatus shown in FIG. 1 with similar processing conditions.

As described above, the silicon oxynitride film is formed by carrying out plasma nitridation process and thermal nitridation process for the silicon oxide film and the resulted nitrogen concentration profile shows that the nitrogen concentration peak is to be formed at about more than or equal to 30 Å deep from a surface which is near the surface of the silicon oxynitride film. The nitrogen concentration profile also shows that the nitrogen concentration peak is also formed within 30 Å from the interface which is near the interface between the base and the silicon oxynitride film.

Here, nitrogen concentration is a value in which the number of nitrogen atoms per unit volume in the silicon oxynitride film is divided by the total number of atoms (the number of all the ions of silicon, oxygen, and nitrogen, and it is about $6.6 \times 10^{22}$) per unit volume in the silicon oxynitride film.

Nitrogen concentration peak means the peak of nitrogen concentration in the nitrogen concentration profile in which nitrogen concentration increases as moving in a depth direction from the surface of the silicon oxynitride film and nitrogen concentration decreases as moving in the depth direction from the surface of the silicon oxynitride film after having the peak.

In the producing method of a semiconductor device in the preferred embodiments of the present invention, each nitrogen concentration of the two nitrogen concentration peaks which are formed near the surface of the silicon oxynitride film and near the interface of the silicon oxide film with the silicon substrate can be made to be 3 to 20%.

Figure 3:
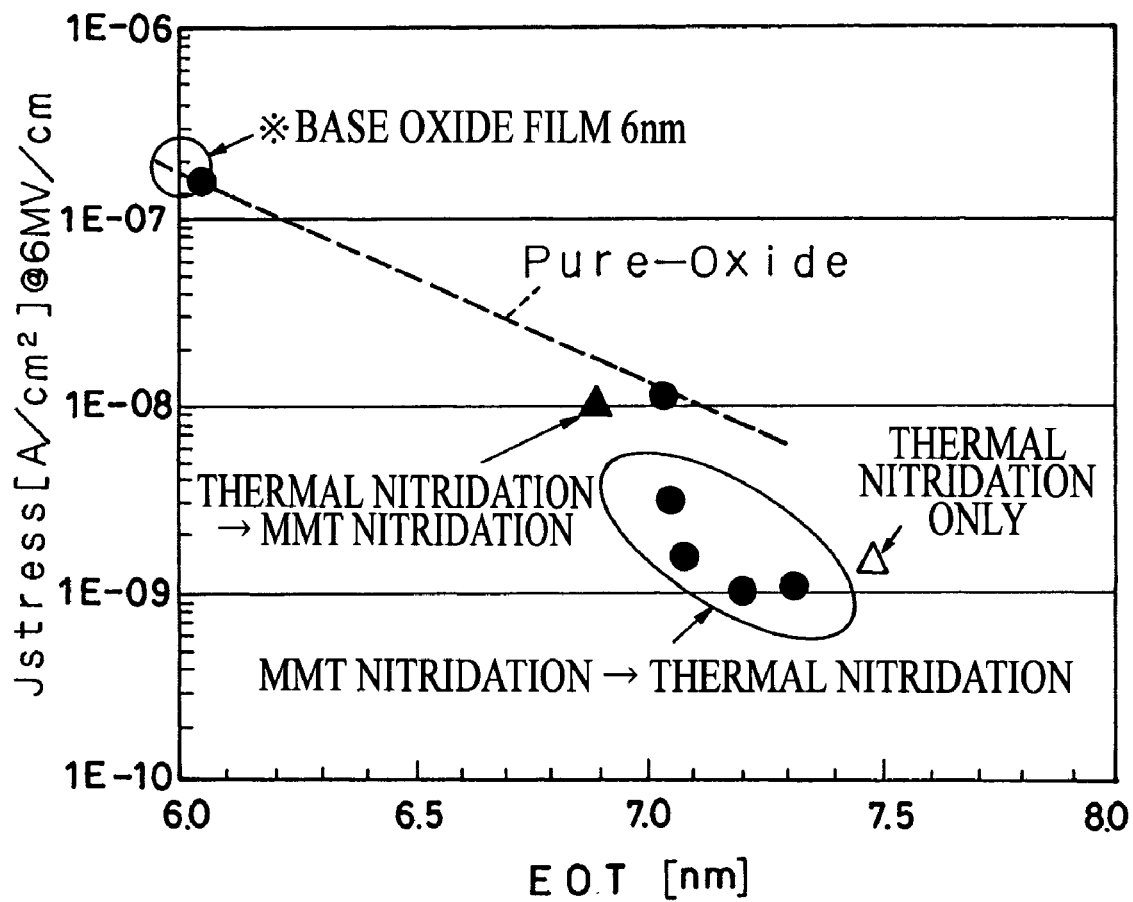
FIG. 3 is a diagram showing an effect of SILC endurance due to a producing method of a semiconductor device of a preferred embodiment of the present invention.

Next, an example of the effect of SILC endurance according to the producing method of a semiconductor device of the preferred embodiment of the present invention is shown in FIG. 3. The lateral axis shows an electrical film thickness (EOT-Equivalent Oxide Thickness), and the vertical axis shows the leak current density which occurs when the electric field of 6 MV/cm is applied. The insulating film reduces the leak current as the film thickness becomes thicker, and the dotted line in the graph shows a characteristic line when pure $SiO_2$ is used. From this result, when comparing in the same EOT value, it can be found that samples in which thermal nitridation is carried out after plasma nitridation is carried out (samples enclosed by a frame of MMT nitridation→thermal nitridation in the diagram) can reduce the leak current more than half digit than the pure $SiO_2$ (pure-Ox in the diagram). In addition, these samples show a tendency in which the leak current is smaller and have high SILC endurance comparing to a sample in which plasma nitridation process is not carried out (thermal nitridation indicated by a white triangle in the diagram) and a sample in which plasma nitridation process is carried out after thermal nitridation is carried out (thermal nitridation→MMT nitridation indicated by a black triangle in the diagram) when having the same EOT value.

The entire disclosures of Japanese Patent Application No. 2004-321439 filed on Nov. 5, 2004 and Japanese Patent Application No. 2005-137308 filed on May 10, 2005 including specifications, claims, drawings and abstracts thereof are incorporated herein by reference in there entireties.

Although various exemplary embodiments have been shown and described, the invention is not limited to the embodiments shown. Therefore, the scope of the invention is intended to be limited solely by the scope of the claims that follow.

As describer above, according to the preferred embodiments of the present invention, a flash device which enhances the SILC endurance and has high reliability can be produced.

As a result, the present invention can especially preferably be utilized for a method for producing a semiconductor device such as a flash device.

The invention claimed is:

1. A producing method of a stress-resilient semiconductor device comprising a step of forming a tunnel insulating film of a flash device, comprising:

a first nitridation step of forming a first silicon oxynitride film by nitriding a silicon oxide film formed on a semiconductor silicon base by one of plasma nitridation and thermal nitridation, the plasma nitridation carrying out nitridation process by using a gas activated by plasma discharging a first gas including a first compound which has at least a nitrogen atom in a chemical formula thereof, and the thermal nitridation carrying out nitridation process using heat by using a second gas including a second compound which has at least a nitrogen atom in a chemical formula thereof, and a second nitridation step of forming a second silicon oxynitride film by nitriding the first silicon oxynitride film by the other of the plasma nitridation and the thermal nitridation, wherein additional nitrogen is supplied to create a tunnel insulating oxide film with additional nitrogen atoms near the interface with the semiconductor base to help suppress leakage of the tunnel insulating oxide film.

2. A producing method of a semiconductor device as recited in claim 1, wherein peaks of nitrogen concentration are formed in a range of up to 3 nm in a depth direction towards a surface from an interface between the base and the second silicon oxynitride film and in a range of up to 3nm in a depth direction towards the interface with the base from the surface of the second silicon oxynitride film, respectively.

3. A producing method of a semiconductor device as recited in claim 1, wherein the second compound is NO or $N_2O$.

4. A producing method of a semiconductor device as recited in claim 1, wherein the second silicon oxynitride film is formed by the thermal nitridation after the first silicon oxynitride film is formed by the plasma nitridation.

5. A producing method of a semiconductor device as recited in claim 1, wherein the silicon oxide film has a film thickness of 4 to 8 nm.

6. A producing method of a semiconductor device as recited in claim 1, wherein the silicon oxide film is formed by a thermal processing oxidization.

7. A producing method of a stress-resilient semiconductor device comprising a step of forming a silicon oxynitride film by nitriding a silicon oxide film formed on a semiconductor silicon base, wherein the silicon oxide film is nitrided so as to form peaks of nitrogen concentration in a range of up to 3 nm in a depth direction towards a surface from an interface between the semiconductor silicon base and the silicon oxynitride film and in a range of up to 3 nm in a depth direction towards an interface with the base from a surface of the silicon oxynitride film, respectively, and supplying additional nitrogen to create a tunnel insulating oxide film with additional nitrogen atoms near the interface with the semiconductor base to help suppress leakage of the tunnel insulating oxide film.

* * * * *